(12) United States Patent
Chao et al.

(10) Patent No.: US 7,432,511 B2
(45) Date of Patent: Oct. 7, 2008

(54) METHOD OF OPERATING LIQUID IN THE VACUUM OR LOW-PRESSURE ENVIRONMENT AND OBSERVING THE OPERATION AND DEVICE FOR THE OPERATION AND OBSERVATION

(75) Inventors: Chih-Yu Chao, Taipei (TW);
Wen-Jiunn Hsieh, Taipei County (TW)

(73) Assignee: Contrel Technology Co., Ltd., SinShin Township (TW)

( * ) Notice: Subject to any disclaimer, the term of this patent is extended or adjusted under 35 U.S.C. 154(b) by 384 days.

(21) Appl. No.: 11/216,044

(22) Filed: Sep. 1, 2005

(65) Prior Publication Data

US 2006/0261284 A1 Nov. 23, 2006

(30) Foreign Application Priority Data

May 9, 2005 (TW) .............................. 94114963 A

(51) Int. Cl.
*G01F 23/00* (2006.01)
*G21K 5/08* (2006.01)
*G21K 5/10* (2006.01)

(52) U.S. Cl. .................. 250/440.11; 250/306; 250/307; 250/311; 250/441.11; 435/29; 435/288.5; 435/288.4; 118/715

(58) Field of Classification Search .................. 250/306, 250/307, 311, 440.11, 441.11; 435/29, 288.5, 435/288.4; 118/715

See application file for complete search history.

(56) References Cited

U.S. PATENT DOCUMENTS

| 4,705,949 A | * | 11/1987 | Grimes et al. | .......... 250/440.11 |
| 5,097,134 A | * | 3/1992 | Kimoto et al. | ........... 250/443.1 |
| 5,922,591 A | * | 7/1999 | Anderson et al. | ........ 435/287.2 |
| 7,230,242 B2 | * | 6/2007 | Behar et al. | ................. 250/310 |
| 2008/0075704 A1 | * | 3/2008 | Wolf et al. | ............... 424/93.21 |

* cited by examiner

*Primary Examiner*—Jack I. Berman
*Assistant Examiner*—Meenakshi S Sahu
(74) *Attorney, Agent, or Firm*—Bacon & Thomas, PLLC

(57) ABSTRACT

A method of operating liquid in a vacuum or low-pressure environment and observing the operation and a device for the operation and the observation respectively, including the steps of preparing a housing, putting the housing in the vacuum or low-pressure environment and control liquid, vapor, and buffer chambers under the same temperature, infusing vapor into the vapor chamber through a gas inlet and control the vapor pressure inside the vapor chamber to be equal to the saturated vapor pressure of a liquid specimen inside the liquid chamber under the same temperature to prevent the inside liquid from volatilization, and evacuating the buffer chamber through the pumping port to pump out the vapor and prevent the vapor from exhausting through outer apertures out of the housing. A probing source can pass through the outer, inner, and vapor apertures for observation and analysis of the liquid specimen inside the liquid chamber.

21 Claims, 11 Drawing Sheets

METHOD OF OPERATING LIQUID IN THE VACUUM OR LOW-PRESSURE ENVIRONMENT AND OBSERVING THE OPERATION AND DEVICE FOR THE OPERATION AND OBSERVATION

BACKGROUND OF THE INVENTION

1. Field of the Invention

The present invention relates generally to the technology of operating liquid substance in the vacuum, and more particularly, to a method of operating liquid in the vacuum or low-pressure environment and observing the operation and a device for the operation and the observation.

2. Description of the Related Art

As far as the technology of microscopic observation is concerned, it is known that a user can employ an electron microscope with its high-power magnification to do scientific research of nanometer substances.

A conventional electron microscope works by utilizing an electron beam to probe the substance. It is necessary to utilize the accelerated electron beam by high voltage and to focus the electron beam by using the electromagnetic lenses to do the microscopic observation in a vacuum environment. As shown in FIG. 13, an electron microscope 81 includes a vacuum specimen chamber 82 for receiving a specimen, and an upper pole piece 86 and a lower pole piece 86 both located in the specimen chamber 82 for ensuring precise focus of the electron beam. The distance between the two pole pieces 86 is 1 cm or so. However, any specimen received in the specimen chamber 82 must be a solid, not a fluid such as liquid or gas, to allow observation in such vacuum environment, since a fluid specimen is subject to immediate boiling, volatilization, or the like.

To overcome the above problem and to allow the specimen received in the electron microscope to coexist with a specific gas, an environment chamber for controlling vapor was invented in 1976 (Hui S. W. et al., Journal of Physics E 9, 69, 1976). An electron microscope 91, as shown in FIGS. 14 and 15, includes a heightened specimen chamber 92, a water tank 94 mounted inside the specimen chamber 92, and an environment chamber 96. The environment chamber 96 has two spacers 962 partitioning its center off into a vapor layer 964 and two buffer layers 966 located respectively below and above the vapor layer 964. The water tank 94 has a vent pipe 941 connected with the vapor layer 964 for providing the vapor layer 964 with vapor. The two spacers 962 and top and bottom sidewalls of the environment chamber 96 are parallel to one another, each having an aperture 963. The apertures 963 are coaxial with one another for penetration of the electron beam. The environment chamber 96 further has a specimen tube 967 extending outwards from the vapor layer 964, a specimen holder 968 extending through the specimen tube 967 into the vapor layer 964 from outside, and an O-ring 969 sealing space between the specimen holder 968 and the vapor layer 964 for insulation between the vapor layer 964 and the outside.

However, the aforementioned structure and prior art could merely control the environment chamber 96 to internally keep in the gasiform or vapor environment other than the liquid one.

Another research group for modification of the electron microscope presented an experiment of observation of gasiform, liquid, and solid chemical reactions under the electron microscope in 2002 (Gai P. L., Microscopy & Microanalysis 8, 21, 2002). However, such design has the following drawbacks. Because the liquid specimen is directly exposed to the gasiform environment in the gas chamber covering the space between the two pole pieces, the liquid in the gas chamber will immediately fully volatilize if partial pressure of the vapor fails to reach the saturated pressure, thus requiring supplementary liquid for entry into the specimen target holder in the gas chamber for continuous observation. However, such entry of supplementary liquid will cause serious problems of flow or uneven admixture of new and original specimens to result in inauthenticity of the observation. In addition, the massive volatilized high-pressure vapor or the outside high-pressure gas infused into the gas chamber will fill the space (about or more than 1 cm) between the pole pieces to cause a more serious effect of multiple scattering of the electrons resulting from electrons impinging the gasiform molecules, further disabling successful imaging of the electron beam or experiment of electron diffraction. In addition, the specimen chamber in design fails to effectively control the amount of the infused liquid, causing excessive thickness of the liquid to further disable penetration of the electron beam through the specimen and thus disabling observation and analysis.

Further, it is necessary to disassemble the primary part of the electron microscope before installing the whole system of Gai's design, such that it hardly possible to mass-produce the system.

There was another window-type design/experiment, Daulton T. L. (Daulton T. L. et al., Microscopy Research & Technique 7, 470, 2001). However, such design tends to cause the multiple scattering of the electrons due to thick window film disabling successful imaging of the electron beam or experiment of electron diffraction. Even if the analysis and observation can be done, the resolution is still greatly reduced. Further, if the pressure difference between the window-type specimen and the specimen chamber is too high, the window film is subject to rupture causing immediate volatilization of the liquid inside the specimen chamber and contamination of the vacuum area in the electron microscope, resulting in further malfunction or damage of the electron microscope.

Since the above-mentioned prior art failed to keep a liquid environment in the vacuum or low-pressure environment for operation and observation by the electron microscope, the present invention provides an advanced technology for keeping a liquid environment in the vacuum or low-pressure environment for operation and observation by the electron microscope without alteration of the original design of the electron microscope.

SUMMARY OF THE INVENTION

The primary objective of the present invention is to provide a method of operating liquid in the vacuum or low-pressure environment and observing the operation, and a device, for the operation and observation, providing a liquid environment in the vacuum or low-pressure environment for observation.

The secondary objective of the present invention is to provide a method of operating liquid in the vacuum or low-pressure environment and observing the operation, and a device, for the operation and observation, providing an environment for observing liquid without alteration of the original design of the electron microscope.

The foregoing objectives of the present invention are attained by the method and the device, which respectively include the following steps and structure:

a) Prepare a housing. The housing has a plurality of spacers partitioning off its inside into a liquid chamber, at least one vapor chamber formed outside the liquid chamber, and at least one buffer chamber formed outside the vapor chamber. The liquid chamber contains a liquid specimen or substance reserved in a liquid. A vapor aperture is provided on each of the spacers located above and below the liquid chamber. Two inner apertures are provided respectively on the spacer located between the vapor chamber and the buffer chamber, respectively located above and below the two vapor apertures. The housing has two outer apertures formed respectively on its top side and its bottom side. The inner and outer apertures are coaxial with the vapor apertures. The housing further has a gas inlet and a pumping port corresponding respectively to the vapor chamber and the buffer chamber.

b) Put the housing in a vacuum or low-pressure environment, and control the liquid, vapor, and buffer chambers to the same temperature.

c) Infuse vapor into the vapor chamber through the gas inlet, and control the vapor pressure inside the vapor chamber to be equal to the saturated vapor pressure of the liquid specimen inside the liquid chamber under the same temperature to prevent the liquid inside the liquid chamber from volatilization out of the vapor apertures. The liquid inside the liquid chamber is maintained in a specific amount without loss. In the meantime, the vapor inside the vapor chamber can slowly leak through the inner apertures into the buffer chamber.

d) Evacuate the buffer chamber through the pumping ports at a predetermined rate to pump out the vapor exhausted through the inner apertures into the buffer chamber and to prevent the vapor from leaking through the outer apertures out of the housing.

Thus, the present invention provides a liquid environment in the vacuum or low-pressure environment to allow the electron beam, ion beam, atom beam, neutron beam, X ray, and other high-coherent beams to pass through the outer and inner apertures and the vapor apertures to conduct observation and analysis of a liquid specimen inside the liquid chamber.

DETAILED DESCRIPTION OF PREFERRED EMBODIMENTS

Figure 1:
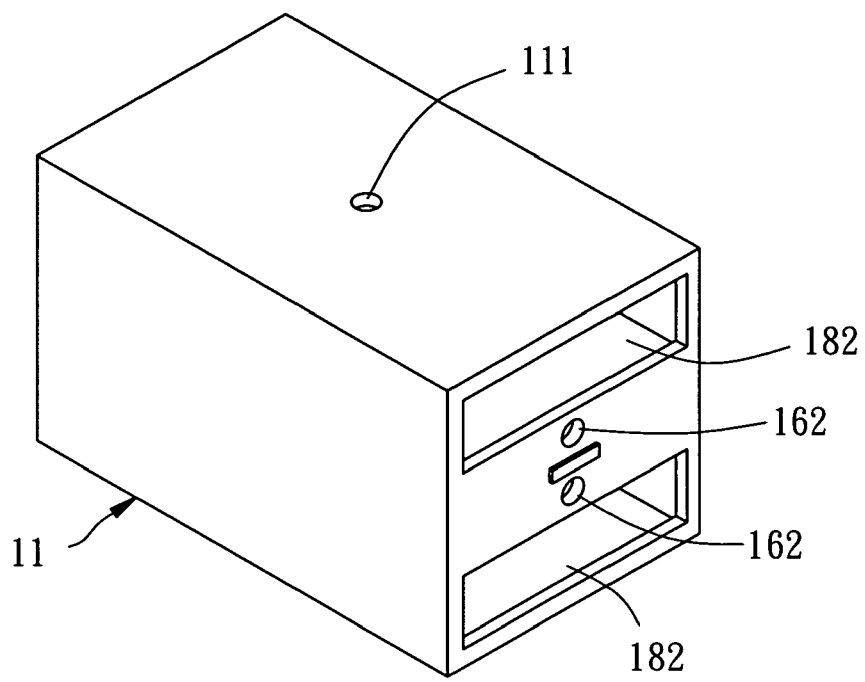
FIG. 1 is a perspective view of a first preferred embodiment of the present invention.
Figure 2:
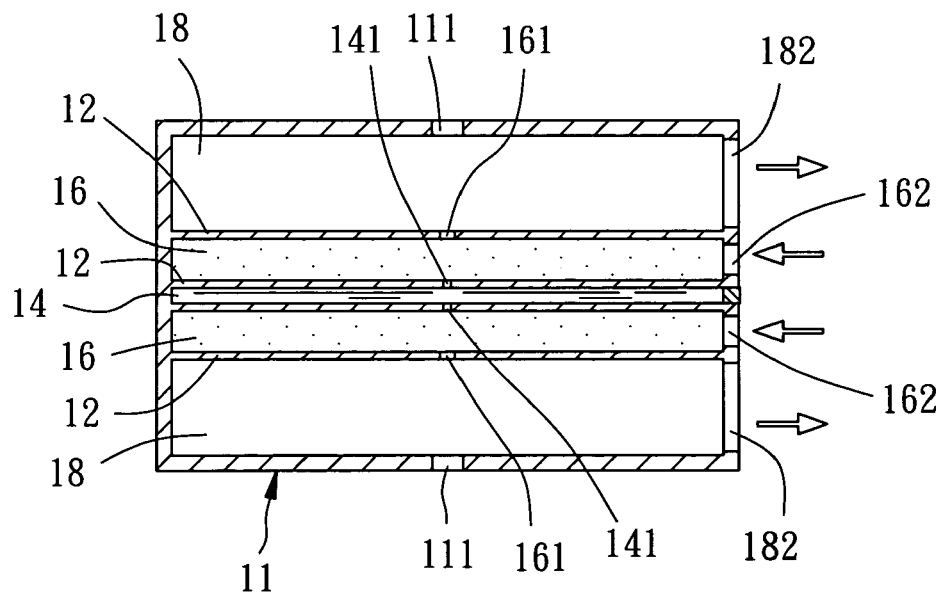
FIG. 2 is a sectional view of the first preferred embodiment of the present invention.
Figure 3:
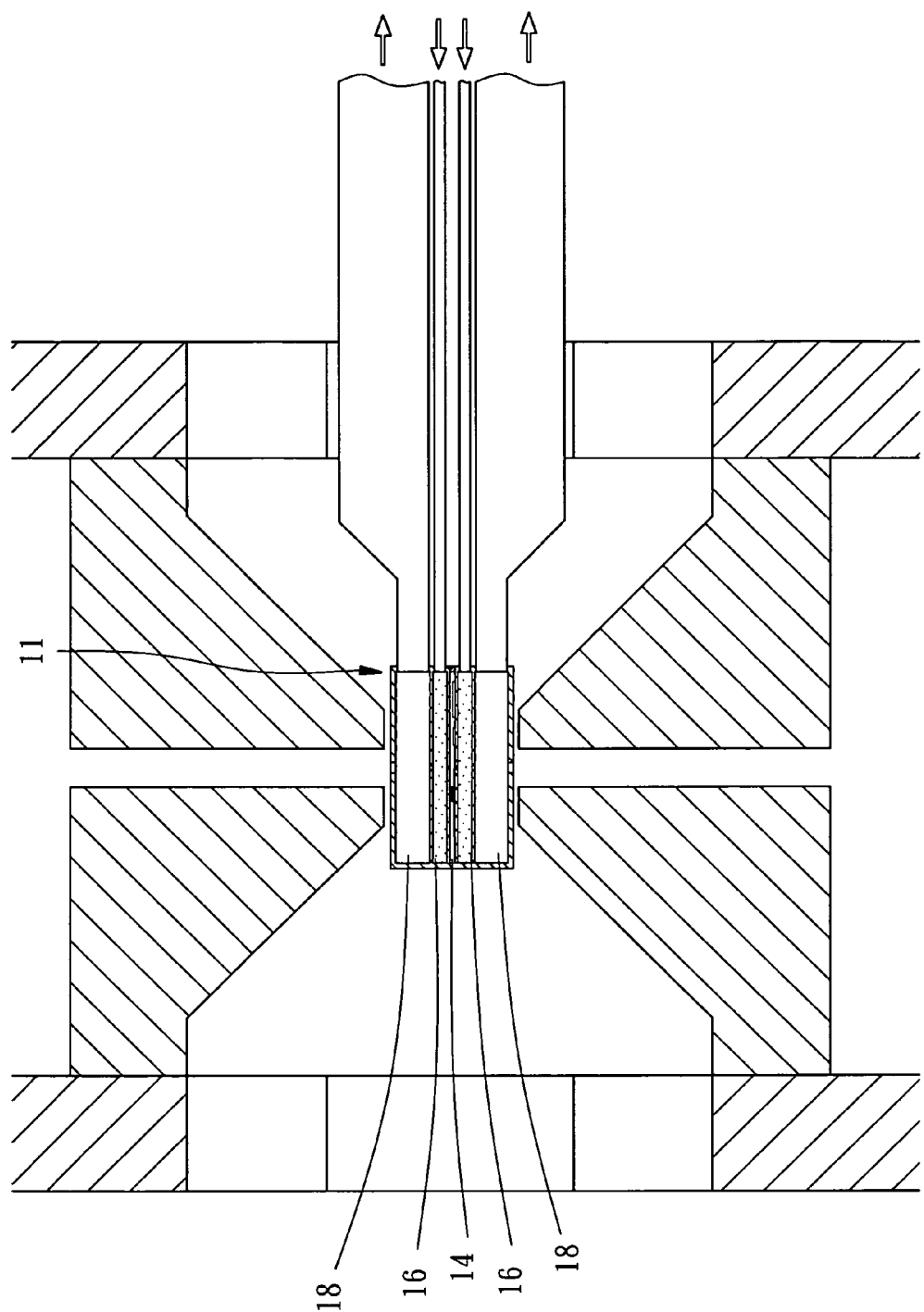
FIG. 3 is a schematic view of the first preferred embodiment of the present invention in cooperation with the electron microscope.

Referring to FIGS. 1-3, a method of operating liquid in the vacuum or low-pressure environment and observing the operation in accordance with a first preferred embodiment of the present invention includes steps as follows.

A. Prepare a housing 11, as shown in FIGS. 1 and 2. The housing 11 has a plurality of spacers 12 partitioning off its inside into a liquid chamber 14, two (upper and lower) vapor chambers 16 formed respectively above and below the liquid chamber 14, and two buffer chambers 18 formed respectively above and below the upper and lower vapor chambers 16. The liquid chamber 14 is smaller than 30 μm in height, and is adapted to contain water or a liquid specimen. Each of the spacers 12 located above and below the liquid chamber 14 has a vapor aperture 141. Each of the spacers 12 located respectively above the upper vapor chamber 16 and below the lower vapor chamber 16 has an inner aperture 161. The two inner apertures 161 are located respectively above and below the two vapor apertures 141. The housing 11 has two outer apertures 111 formed respectively on top and bottom sides of the housing. The outer apertures 111 are coaxial with the inner apertures 161 and the vapor apertures 141. In this embodiment, each of the vapor apertures 141 has a diameter of 50 μm; each of the inner apertures 161 has a diameter of 100 μm; and each of the outer apertures 111 has a diameter of 200 μm. The housing 11 has two gas inlets 162 corresponding to the two vapor chambers 16, and two pumping ports 182 corresponding to the two buffer chambers 18.

B. Put the housing 11 under the vacuum or low-pressure environment, as shown in FIG. 3, such as the vacuum environment in a specimen chamber of an electron microscope, and control the temperature of the liquid, vapor, and buffer chambers 14, 16, and 18 to be the same temperature (such as 37 degrees Celsius (37° C.) in the present embodiment).

C. Infuse vapor through the two gas inlets 162 into the two vapor chambers 16, control the temperature of the infused vapor to be lower than or equal to that of the two vapor chambers 16, thus preventing the infused vapor from condensation inside the vapor chambers 16; and control the vapor pressure inside the two vapor chambers 16 to reach the saturated vapor pressure of the liquid specimen inside the liquid chamber 14 under the same temperature (37° C.). As a result, the water or liquid sample inside the liquid chamber 14 is prevented from volatilization that would occur if the partial water vapor pressure of the total gas pressure in the two vapor chambers 16 fails to reach the saturated water vapor pressure (of 47 torrs) under that temperature (37° C.). Thus, the water inside the liquid chamber 14 can be maintained in a specific amount without loss. In addition, the vapor inside the two vapor chambers 16 can slowly exhaust through the inner apertures 161 into the two buffer chambers 18.

D. Evacuate the two buffer chambers 18 through the two pumping ports 182, and control the pumping rate for the buffer chambers 18 at 80 L/sec or higher, to pump out vapor exhausting through the inner apertures 161 into the buffer chambers 18 and to prevent the vapor from leaking through the outer apertures 111 out of the housing 11. Because the liquid inside the liquid chamber 14 is very thin, having a thickness smaller than 30 μm, the weight of the liquid can be ignored. Thus, the extremely thin liquid can be maintained inside the liquid chamber 14 under the surface tension without flowing out of the liquid chamber 14 to keep the liquid in the specific amount without loss.

The aforementioned method can enable operating the liquid in the vacuum or low-pressure environment, wherein the amount of liquid inside the liquid chamber 14 will not decrease, for passage through the outer, inner, and vapor apertures 111, 161, and 141 of the electron beam of the electron microscope to conduct observation on the liquid specimen inside the liquid chamber 14. If a specimen (not shown), like biological specimen, is put into the liquid chamber 14, the specimen is right under the liquid environment for inspection and observation under the electron microscope.

In addition, the gas infused into the vapor chambers 16 can alternatively be a mixture of a specific vapor and a specific gas, like nitrogen ($N_2$), oxygen ($O_2$), carbon dioxide ($CO_2$), or other inert gas, or a composition of the aforementioned gases, for refraining or reducing the volatilization of the vapor of a specific liquid inside the liquid chamber 14 by means of vapor pressure of the specific vapor provided into the vapor chambers 16. The specific gas requires heating in advance and control of the temperature slightly higher than or equal to that of the specific vapor to prevent the specific vapor from condensation inside the vapor chambers 16.

Figure 4:
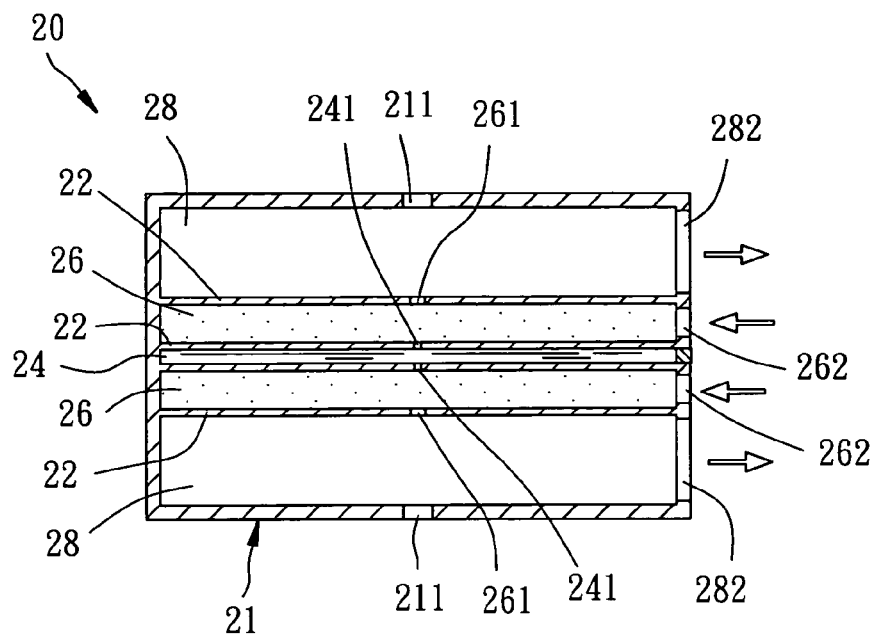
FIG. 4 is a sectional view of a second preferred embodiment of the present invention.

Referring to FIG. 4, a device 20 for operating the liquid in the vacuum or low-pressure environment and observing the operation in accordance with a second preferred embodiment of the present invention includes a housing 21. The housing 21 has a plurality of spacers 22 partitioning off its inside into a liquid chamber 24, two vapor chambers 26 formed respectively above and below the liquid chamber 24, and at least two buffer chambers 28 formed respectively above and below the two vapor chambers 26. The liquid chamber 24 contains a liquid specimen. Each of the spacers 22 located at a top side and a bottom side of the liquid chamber 24 has a vapor aperture 241, which has a diameter of 5-100 μm. Each of the spacers 22 located respectively above and below the liquid chamber 24 has an inner aperture 261, which has a diameter of 10-200 μm, and abuts the buffer chamber 28 and the vapor chamber 26. The two inner apertures 261 are located respectively above and below, and coaxially aligned with, the two vapor apertures 241. The housing 21 has two outer apertures 211 formed respectively on its top side and its bottom side. Each of the outer apertures 211 has a diameter of 20-800 μm. The inner, outer, and vapor apertures 261, 211, and 241 are coaxial with one another. The housing 21 has two gas inlets 262 corresponding respectively to the two vapor chambers 26, and two pumping ports 282 corresponding respectively to the two buffer chambers 28. Each of the outer apertures 211 is larger in diameter than each of the inner apertures 261. The overall height of the housing 21 is less than about 1 cm.

The device 20 of the second embodiment of the present invention is operated subject to the method of the first embodiment, for operating the liquid in the vacuum or low-pressure environment and observing the operation under the electron microscope.

Figure 5:
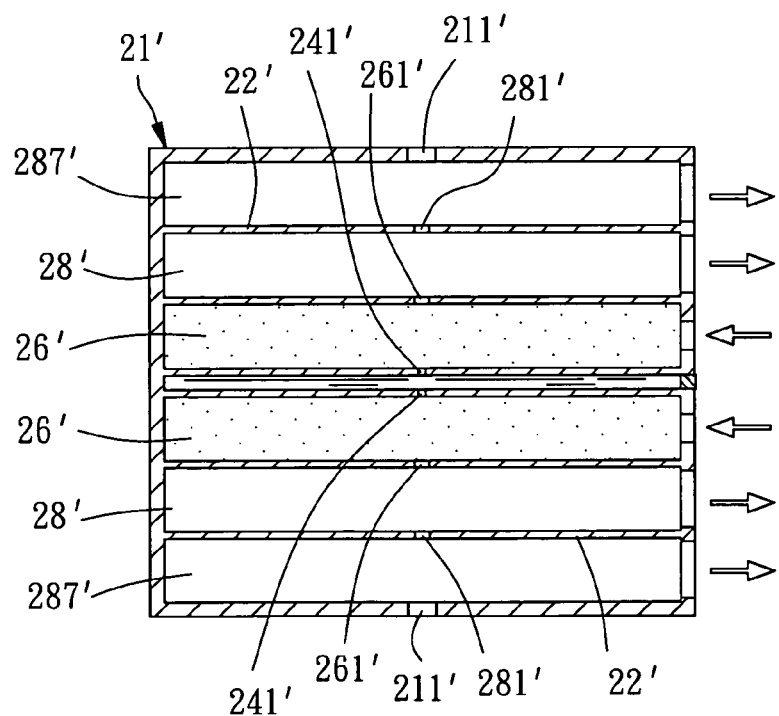
FIG. 5 is another sectional view of the second preferred embodiment of the present invention.

Referring to FIG. 5, two additional buffer chambers 287' can be formed respectively above and below the two buffer chambers 28'. Each of the spacers 22' located respectively above and below the two buffer chambers 28' has a buffer aperture 281', which has a diameter of 10-400 μm, and abuts the additional buffer chamber 287' and the buffer chambers 28'. The outer, buffer, inner, and vapor apertures 211', 281', 261', and 241' are coaxial with one another. The diameter of each buffer aperture 281' is defined to be greater than the diameter of the inner apertures 261', and less than the diameter of the outer apertures 211'. The two additional buffer chambers 287' and the two buffer chambers 28' function as multilayered depressurization based on the principle of differential pumping to enable much flexible maneuverability over the pumping rate thereof and to enable the gas pressure inside the vapor chambers 26' to reach the standard atmospheric pressure. While infusing a gas into the two vapor chambers 26', the gas can be a mixture of vapor and a specific gas, like nitrogen, oxygen, carbon oxide, or other inert gas, under one atmospheric pressure totally. To prevent the water inside the liquid chamber from volatilization, the pressure of the infused water vapor into the two vapor chambers 26' must be controlled at 47 torrs, which is the saturated vapor pressure of the water at 37° C., and the infused specific gas can be nitrogen or helium under 37° C. and 710 torrs. Differentially pumping rates of the buffer chambers 28' and the additional buffer chambers 287' are controlled to be higher than 160 L/sec and 240 L/sec respectively, to enable the gas and vapor exhausting into the additional buffer chambers 287' to be pumped out and to prevent the gas and vapor from leaking through the outer apertures 211' out of the housing 21'. Meanwhile, the gas pressure inside the vapor chambers 26' can be maintained under the standard atmospheric pressure.

Figure 6:
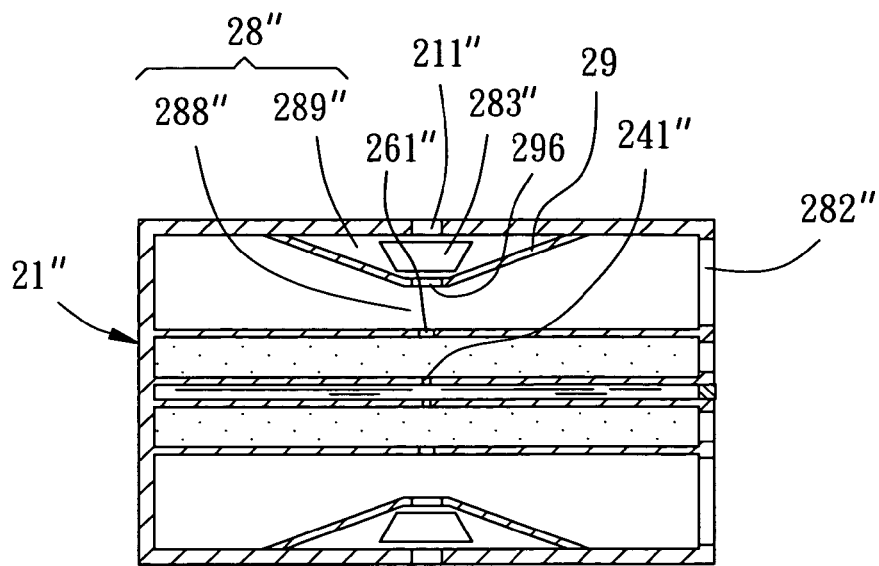
FIG. 6 is another sectional view of the second preferred embodiment of the present invention.
Figure 7:
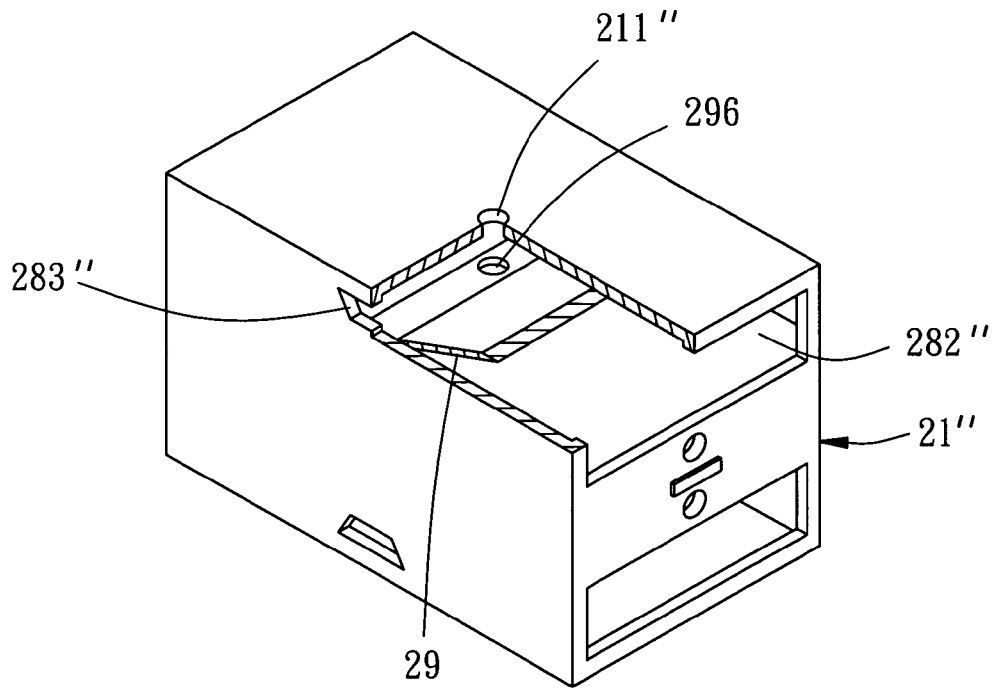
FIG. 7 is a perspective view of the second preferred embodiment of the present invention.

Referring to FIGS. 6 and 7, an inclined spacer 29 can be alternatively mounted in each of the buffer chambers 28" in the second embodiment of the present invention to enable the housing 21" to have more buffer chambers without heightening the housing 21". Each of the inclined spacer 29 partitions off the buffer chambers 28" into two auxiliary buffer chambers 288" and 289", and has a buffer aperture 296 thereon, which is coaxial with the inner, outer, and vapor apertures 261", 211", and 241". The auxiliary buffer chambers 288" correspond respectively to two pumping ports 282" of the housing 21", and the two auxiliary buffer chambers 289" correspond respectively to another two pumping ports 283" of the housing 21" for evacuation. The pumping rate of the auxiliary buffer chamber 289" must keep larger than that of the auxiliary buffer chamber 288" to avoid pumping backflow. The operation of such structure is substantially the same as that of the above-mentioned embodiment, having advantages of multiple buffer chambers to enable flexible maneuverability of the pumping rate of each buffer chamber and to effect the multilayered depressurization by differential pumping, thus attaining the above-mentioned effect as indicated in FIG. 5.

Figure 8:
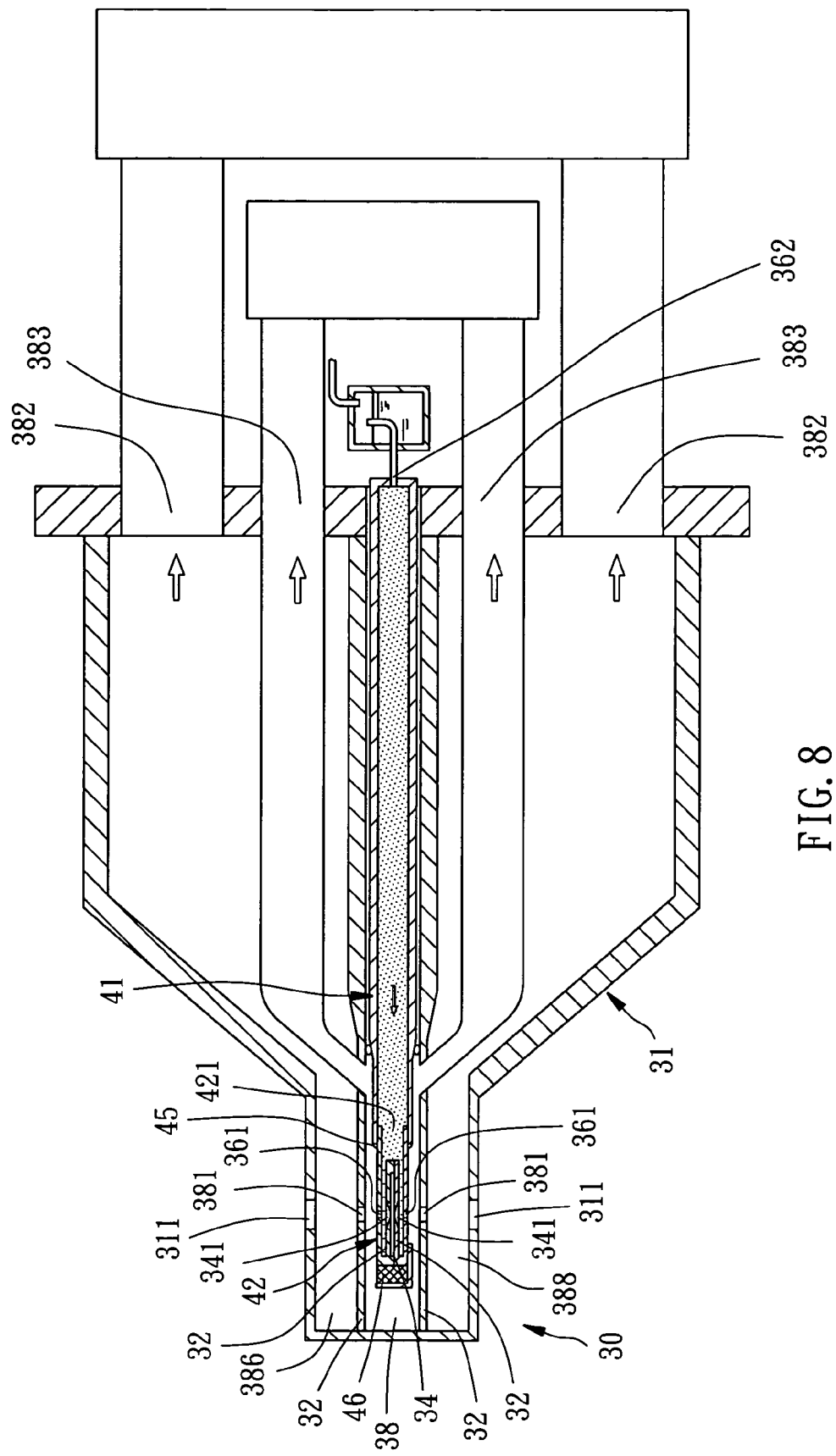
FIG. 8 is a sectional view of a third preferred embodiment of the present invention.
Figure 9:
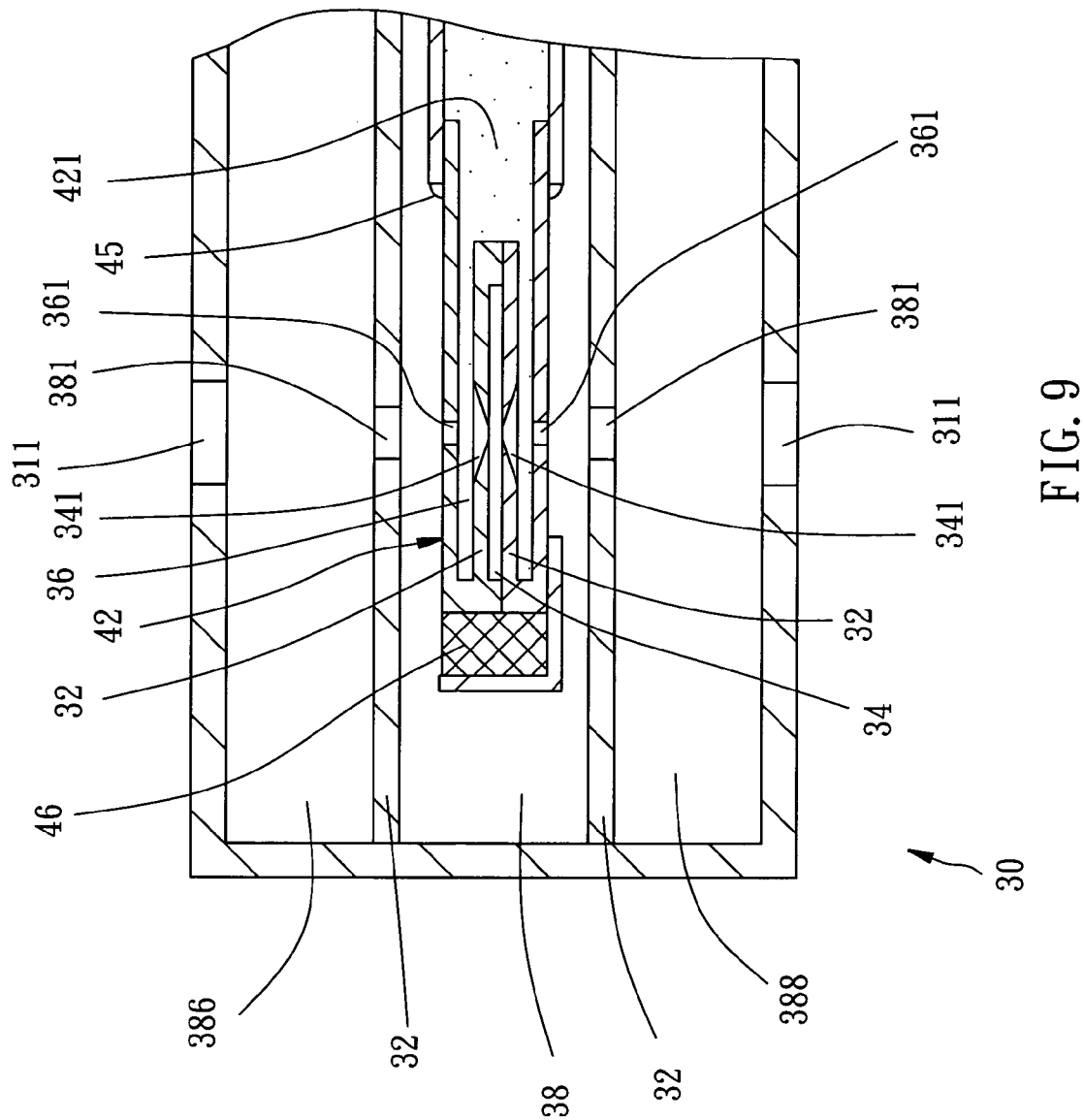
FIG. 9 is a partial enlarged view of the third preferred embodiment of the present invention.

Referring to FIGS. 8 and 9, the device 30 for operating the liquid in the vacuum or low-pressure environment and observing the operation in accordance with a third preferred embodiment of the present invention is similar to the above-mentioned embodiments, but having difference recited below.

The device 30 further includes a hollow specimen holder 41, a box 42, and a plurality of spacers 32. The box 42 is fixed to the specimen holder 41 by an adhesive 45. The box 42 has an opening 421 formed in a side thereof for communication with the specimen holder 41. A vapor chamber 36 is located inside the box 42. The specimen holder 41 has a retaining wall 46 surrounding the box 42 for securing the box 42 in position. A gas inlet 362 is located on the specimen holder 41 for communication with the vapor chamber 36. The box 42 has a plurality of spacers 32 partitioning off its inside into the liquid chamber 34 and two vapor chambers 36 formed outside the liquid chamber 34. Each of the two spacers 32 has a vapor aperture 341, located at top and bottom sides of the liquid chamber 34. Each of the vapor apertures 341 is taper-shaped, whereby the thickness of each sidewall is smallest at the center of the sidewall surrounding the vapor aperture 341.

Two inner apertures 361 are formed respectively on top and bottom sides of the box 42. The housing 31 has a plurality of spacers 32 partitioning off its interior space into the buffer chamber 38, in which the hollow specimen holder 41 is located, and an upper additional buffer chamber 386 and a lower additional buffer chamber 388, both of which are formed respectively above and below the buffer chamber 38. The buffer chamber 38 corresponds to two pumping ports 383. Each of the upper and lower additional buffer chambers 386 and 388 corresponds to a pumping port 382. The pumping rate of each of the upper and lower additional buffer chambers is maintained larger than that of the buffer chamber 38. The pumping ports 382 and 383 are located on the housing 31. Each of the spacers 32 located respectively between the buffer chamber 38 and the upper additional buffer chamber 386 and between the buffer chamber 38 and the lower additional buffer chamber 388 has a buffer aperture 381, which is coaxial with the outer apertures 311, the inner apertures 361, and the vapor apertures 341.

The operation of the third embodiment is identical to that of the second embodiment, such that no further recitation is necessary. In this embodiment, the liquid and vapor chambers 34 and 36 are formed inside the specimen holder 41. The buffer chambers 38, 386, and 388 are formed as two buffer layers outside the specimen holder 41, and the temperature of each of the buffer chambers 38, 386, and 388, and the specimen holder 41, is set slightly greater than, or equal to, that of the vapor infused from the gas inlet 362, to prevent the vapor from condensation during the whole operation. Such two differentially pumped buffer layers effect the multilayered depressurization as the same effect as the second embodiment in FIG. 5 to enable the gas pressure inside the vapor chamber 36 to reach the standard atmospheric pressure. In addition, inclined spacers can be alternatively mounted in the upper and lower additional buffer chambers 386 and 388, similar to those indicated in FIG. 6, to increase the number of the buffer chambers within the housing 31 without heightening the housing 31. The increased number of differentially pumped buffer chambers further enhances the effect of the multilayered pressure buffering (depressurization), thus enabling the gas pressure inside the vapor chamber 36 to reach up to more than one atmospheric pressure.

Figure 10:
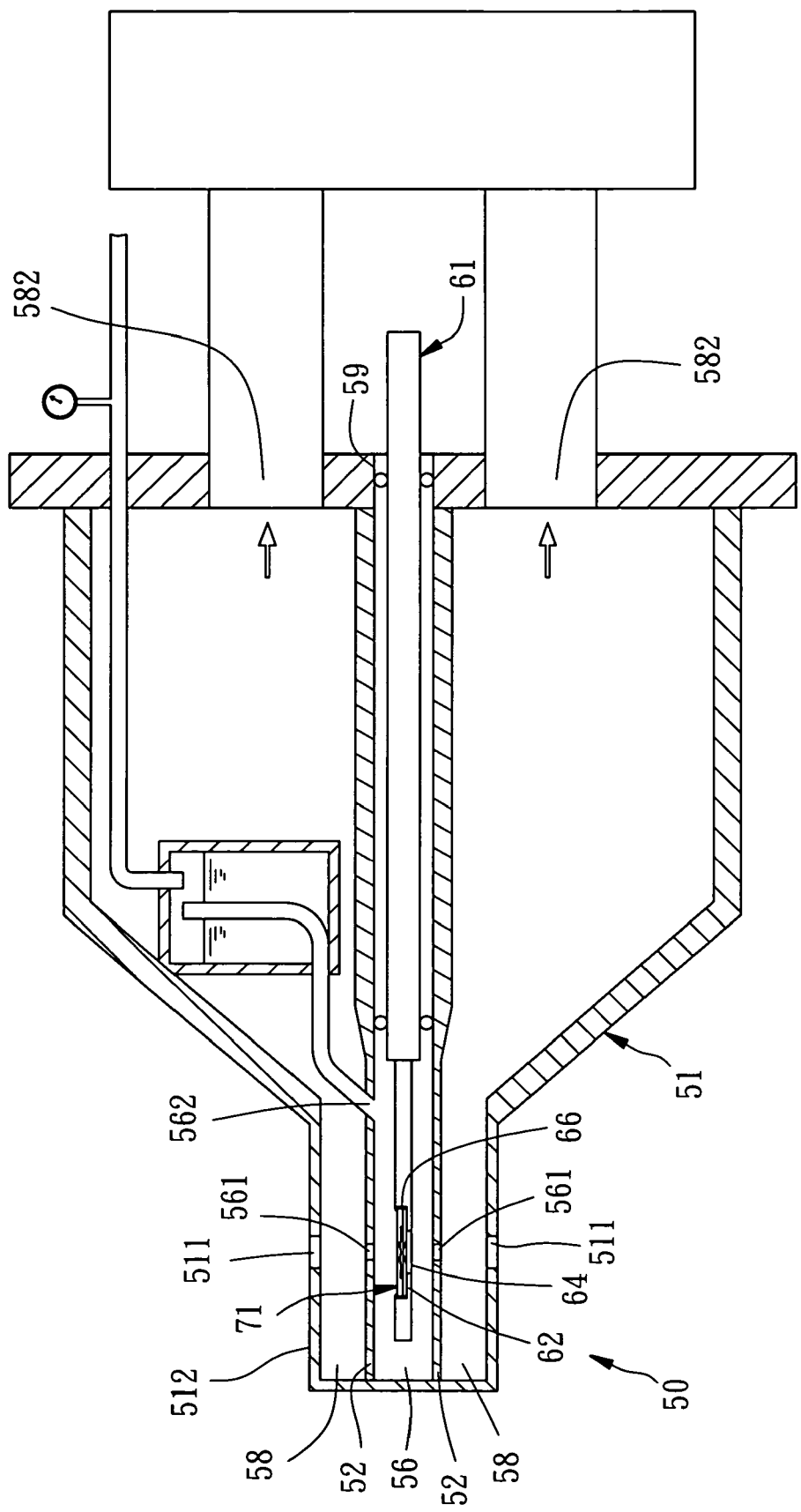
FIG. 10 is a sectional view of a fourth preferred embodiment of the present invention.
Figure 11:
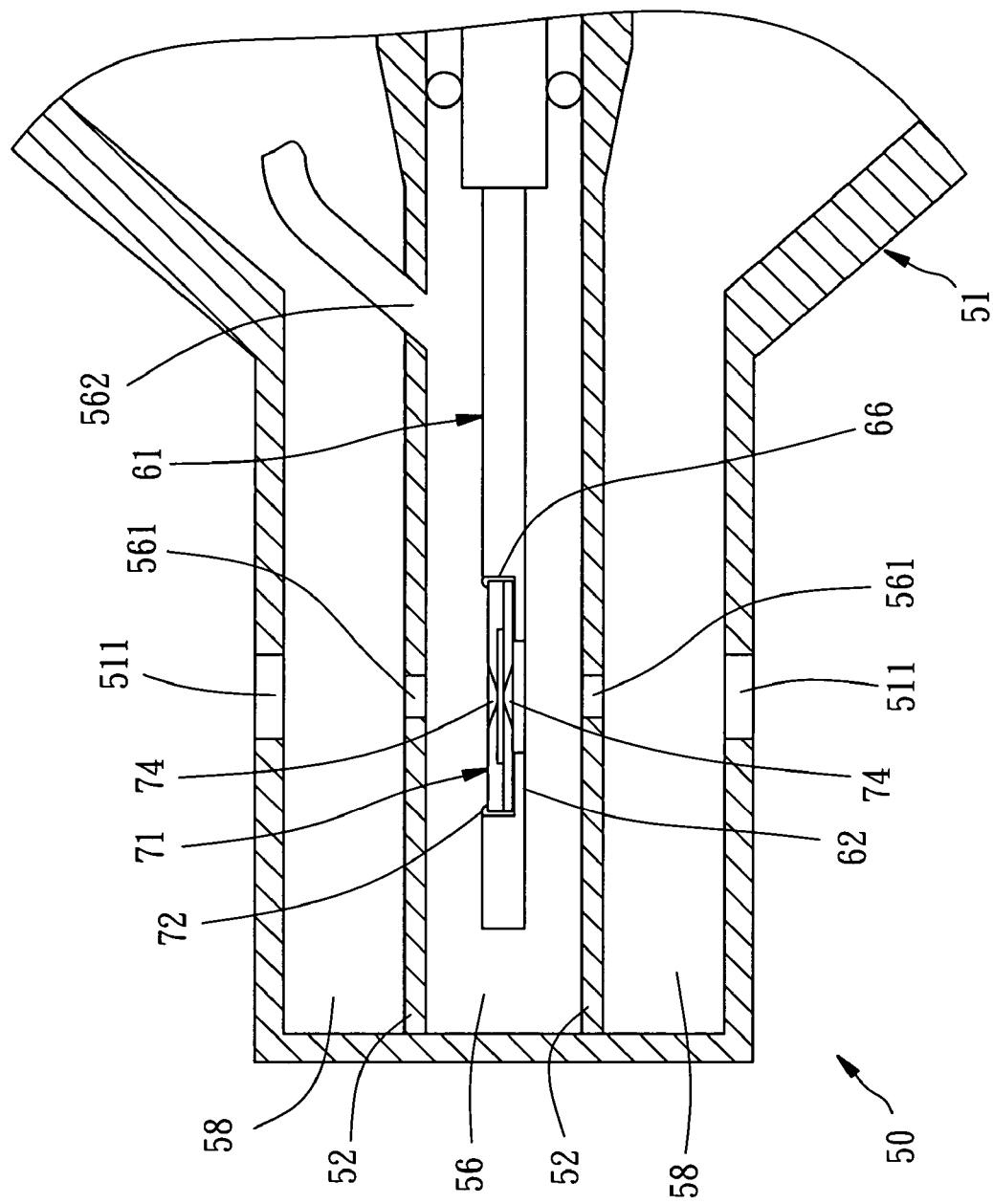
FIG. 11 is a partial enlarged view of the fourth preferred embodiment of the present invention.
Figure 13:
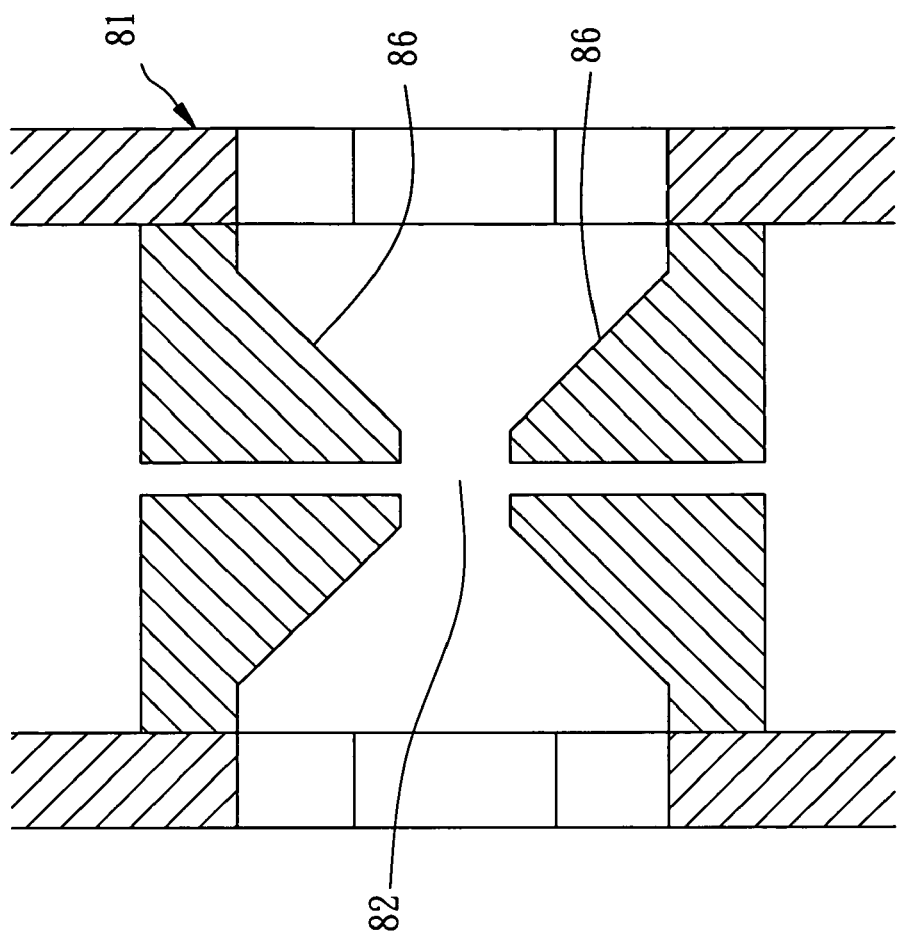
FIG. 13 is a sectional view of an internal part of the electron microscope.
Figure 12:
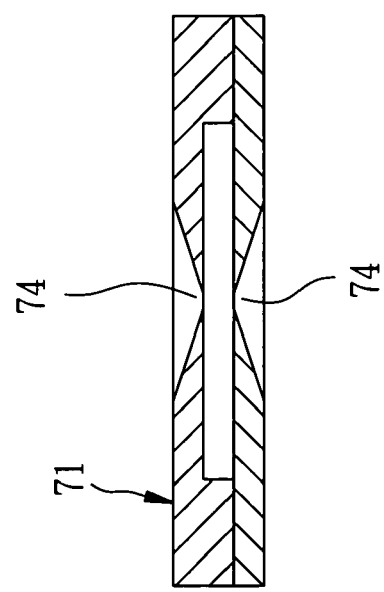
FIG. 12 shows a sectional view of the liquid box constructed according to the fourth preferred embodiment of the present invention.
Figure 14:
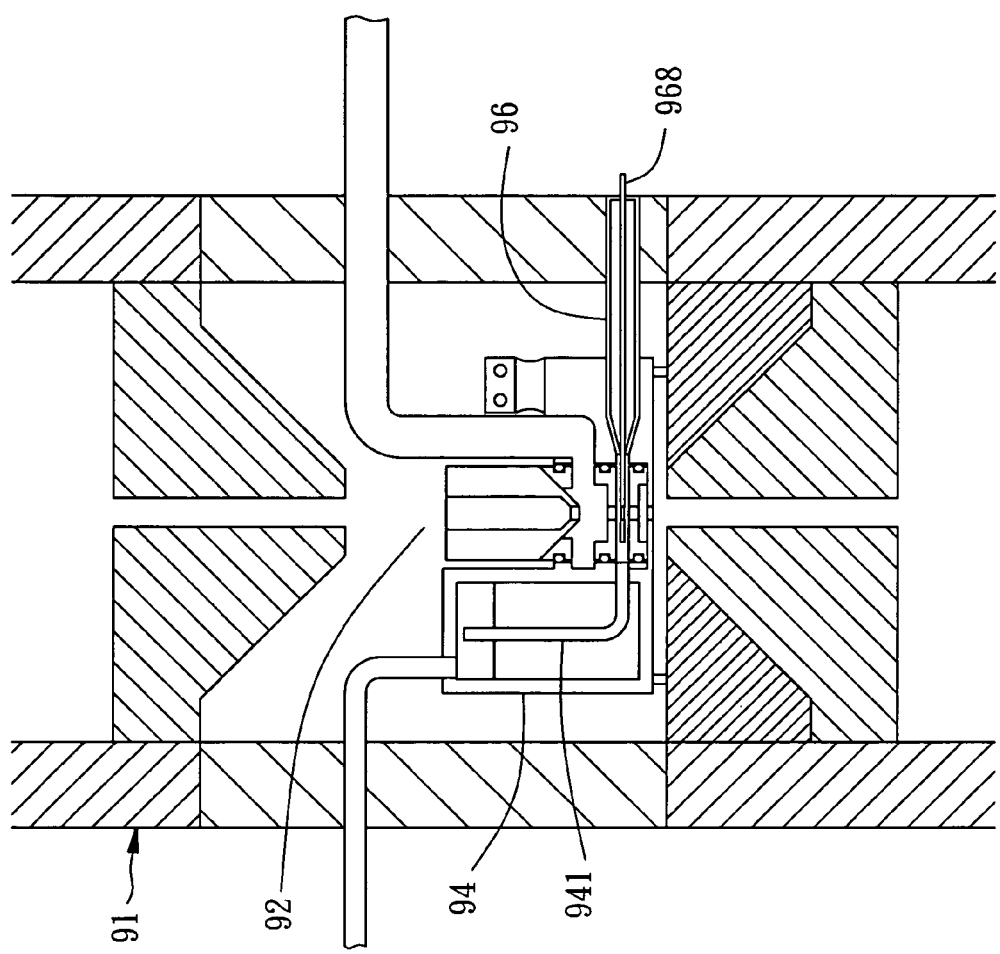
FIG. 14 is a sectional view of the prior art in cooperation with the electron microscope.
Figure 15:
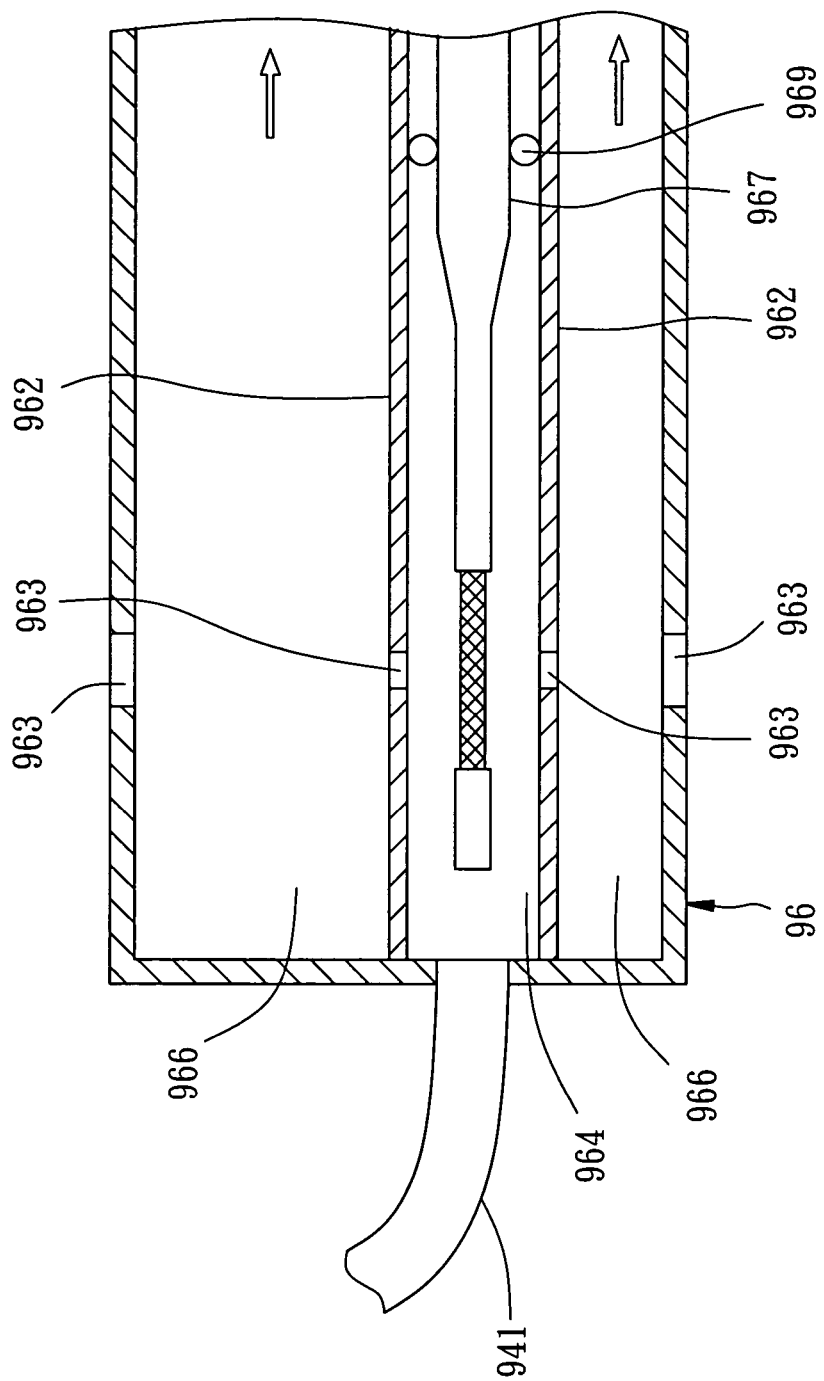
FIG. 15 is a partial sectional view of the prior art.

Referring to FIGS. 10-12, the device 50 for operating the liquid in the vacuum or low-pressure environment and observing the operation in accordance with a fourth preferred embodiment of the present invention includes a housing 51, a specimen holder 61, and a liquid box 71.

The housing 51 has a plurality of spacers 52 partitioning off its inside into a vapor chamber 56 and two buffer chambers 58 formed respectively above and below the vapor chamber 56. Each of the spacers 52 located between the vapor chamber 56 and the buffer chambers 58 has an inner aperture 561. The housing 51 has two outer apertures 511 on its top and bottom sides, a gas inlet 562 corresponding to the vapor chamber 56, and two pumping ports 582 corresponding respectively to the two buffer chambers 58. The housing further has a thinner part 512 at a side thereof, on which the inner and outer apertures 561 and 511 are located. The inner apertures 561 and the outer apertures 511 are coaxially aligned.

The specimen holder 61 has a target stage 62, which has an opening 64 and a retaining wall 66 formed around the target stage 62. The housing 51 has an insertion slot 59 in communication with the vapor chamber 56. The specimen holder 61 is inserted through the insertion slot 59 into the vapor chamber 56, enabling the opening 64 to be coaxial with the inner apertures 561.

The liquid box 71 is fixed on the target stage by an adhesive 72 and surrounded by the retaining wall 66, containing a liquid specimen therein and located at a midsection of the vapor chamber 56. The liquid box 71 has two vapor apertures 74 formed respectively on its top and bottom sides. Each of the vapor apertures 74 is taper-shaped, whereby the thickness of each sidewall is smallest at the center of the sidewall surrounding the vapor aperture 74, and is coaxial with the inner and outer apertures 561 and 511.

The operation of the fourth embodiment is identical to that of the first embodiment such that no further recitation is necessary. Inclined spacers can be alternatively mounted in the device 50, similar to those indicated in FIG. 6, to enable the housing 51 to create more buffer chambers 58 without heightening the housing 51. By means of the multilayered differential pumping, the increased number of the buffer chambers effects the multilayered depressurization and enables greater pressure buffering, further enabling the gas pressure inside the vapor chamber 56 to reach the standard atmospheric pressure, and thereby enabling operating of the liquid specimen under the standard atmospheric pressure in the vacuum or low-pressure environment. The operation of such structure is identical to that of the second embodiment such that no further recitation is needed here.

In conclusion, the present invention includes advantages as follows.

1. The present invention provides an environment for operating a liquid in the vacuum or low-pressure environment and observing the operation under the electron microscope, being unprecedentedly innovative and advancing the medicine, biology, physics, chemistry, material, etc. for great progress and development.

2. The present invention can provide the environment for observation of the liquid without alteration of the original design of electron microscope and for direct operation in the specimen chamber of the electron microscope, being of easy operation and simple assembly.

3. In the prior art, the path that electron beam passes through the gas is equal to or larger than the distance between the two pole pieces of the electron microscope, allowing the electron beam to impinge too many gasiform molecules and to thereby incur serious multiple scattering of electrons. The present invention employs the very thin buffer, vapor, and liquid chambers to avoid the multiple scattering of electrons.

4. In the prior art, because the partial vapor pressure inside the gas chamber does not reach the saturated vapor pressure of the liquid specimen, the liquid in the gas chamber will quickly volatilize, and thus continuously require supplementary liquid for entry into the specimen target holder in the gas chamber, thereby causing problems of difficulty in controlling the thickness of the liquid specimen, serious flow of the specimen, and uneven admixture of the new and old specimens, affecting the authenticity of the observation. The present invention can control the partial vapor pressure inside the vapor chamber to reach the saturated vapor pressure of the liquid specimen to prevent the liquid inside the liquid chamber from volatilization, thus requiring none of any supplementary liquid and keeping a liquid environment in the vacuum for operation, observation, and analysis.

It is to be noted that the temperature, vapor pressure, and diameter of each of the vapor, inner, and outer apertures mentioned in the present invention are merely for examples but not to limit the scope of the present invention, and the variations of the diameter, pressure, or pumping rate are still included in the claim of the present invention.

In addition to the specimen chamber (by electron beam) inside the electron microscope, the present invention can be applicable to other vacuum or low-pressure environment with the probing source, like ion beam, atom beam, neutron beam, x ray, or other high coherent beams for observation or probe.

What is claimed is:

1. A method of operating liquid in a vacuum or low-pressure environment and observing the operation, said method comprising the steps of:
    (a) preparing a housing, said housing having a plurality of spacers partitioning off an interior space of the housing into a liquid chamber, at least one vapor chamber formed outside said liquid chamber, and at least one buffer chamber formed outside said vapor chamber, said liquid chamber containing a liquid specimen, each of said spacers located respectively above and below said liquid chamber having a vapor aperture, each of said spacers located respectively above and below said vapor chamber having an inner aperture, the inner apertures being located respectively above and below said vapor apertures, said housing having two outer apertures formed respectively on its top and bottom sides, said vapor apertures are coaxial with said inner and outer apertures, and said housing has a gas inlet corresponding to said vapor chamber and a pumping port corresponding to said buffer chamber;
    (b) putting said housing in the vacuum or low-pressure environment and controlling said liquid, vapor, and buffer chambers under the same temperature;
    (c) infusing vapor through said gas inlet into said vapor chamber and controlling the vapor pressure inside said vapor chamber to equal the saturated vapor pressure of said liquid specimen inside said liquid chamber under the same temperature to prevent the liquid inside said liquid chamber from volatilization out of said vapor apertures and to keep the liquid in a specific amount in said liquid chamber without loss; meanwhile, the vapor inside said vapor chamber slowly exhausting through said inner apertures into said buffer chamber; and
    (d) evacuating said buffer chamber through said pumping ports at a predetermined rate to pump out the vapor exhausted through said inner apertures into said buffer chamber and to prevent the vapor from leaking through said outer apertures out of said housing;
    whereby operating liquid in the vacuum or low-pressure environment is achieved.

2. The method as defined in claim 1, wherein the vapor infused into said vapor chamber in the step (c) is equal to or smaller than that of said vapor chamber in temperature.

3. The method as defined in claim 1, wherein the vapor infused into said vapor chamber in the step (c) can be a specific gas or vapor or a mixture of the vapor and the specific gas.

4. The method as defined in claim 3, wherein the temperature of said vapor is equal to or smaller than that of said specific gas.

5. The method as defined in claim 3, wherein said specific gas is nitrogen, oxygen, carbon dioxide, other inert gas, or a mixture of aforesaid gases.

6. A device for operating liquid in the vacuum or low-pressure environment and observing the operation, comprising:
    a housing having a plurality of spacers partitioning off an interior space of the housing into a liquid chamber, at least one vapor chamber formed outside said liquid chamber, and at least one buffer chamber formed outside said vapor chamber, said liquid chamber containing a liquid specimen, each of said spacers respectively above and below said liquid chamber having a vapor aperture, each of said spacers located respectively above and below said vapor chamber having an inner aperture, the inner apertures being located respectively above and below said two vapor apertures, said housing having two outer apertures formed respectively on its top and bottom sides, said vapor apertures being coaxial with said inner and outer apertures, said housing having a gas inlet corresponding to said vapor chamber and a pumping port corresponding to said buffer chamber.

7. The device as defined in claim 6, wherein said housing comprises two inclined spacers mounted in said buffer chamber and located respectively above and below said two inner apertures for partitioning off said buffer chamber into two auxiliary buffer chambers, each of said two inclined spacers having a buffer aperture coaxial with said inner and outer apertures, each of said auxiliary buffer chambers corresponding to said pumping port of said housing.

8. The device as defined in claim 7, wherein said two auxiliary buffer chambers communicate with said two outer apertures; said buffer chamber communicates with said two auxiliary buffer chambers through said two buffer apertures, each of said two auxiliary buffer chambers being larger in pumping rate than said buffer chamber.

9. A method for using the device of claim 7 for operating liquid in a vacuum or low-pressure environment and observing the operation, said method comprising the steps of:
    maintaining a gas within said vapor chamber at a pressure over 760 torrs;
    pumping said buffer chamber at a rate over than 160 L/sec; and
    pumping each of said auxiliary buffer chambers at a rate over 240 L/sec.

10. The device as defined in claim 7, wherein each of said buffer apertures has a diameter of 10-400 μm between those of said inner and outer apertures.

11. The device as defined in claim 6 further comprising a hollow specimen holder, wherein said specimen holder has a box at its distal end, said box having an opening in communication with said specimen holder; said vapor chamber being located in said box; said gas inlet being located in said specimen holder and in communication with said vapor chamber; said liquid chamber being located in said box; said inner apertures are located respectively on a top sidewall and a bottom sidewall of said box; said buffer chamber being located outside said specimen holder; said spacers further partition off the inside of said housing into an upper additional buffer chamber and a lower additional buffer chamber located respectively above and below said buffer chamber, said housing having a plurality of pumping ports, each of said buffer chambers and said upper and lower additional buffer chambers corresponding to one of said pumping ports, each of said spacers located between said buffer chamber and said upper and lower additional buffer chambers having a buffer aperture, said buffer apertures being coaxial with said outer, inner, and vapor apertures.

12. The device as defined in claim 6, wherein each of said vapor apertures is taper-shaped whereby the thickness of each sidewall is smallest at the center of the sidewall surrounding said vapor aperture.

13. The device as defined in claim 6, wherein each of said outer apertures is larger in diameter than said inner apertures.

14. The device as defined in claim 6, wherein each of said vapor apertures comprises a diameter of 5-100 μm; each of said inner apertures comprises a diameter of 10-200 μm; each of said outer apertures comprises a diameter of 20-800 μm.

15. The device as defined in claim 6, wherein said liquid specimen in said liquid chamber is smaller in thickness than 30 µm.

16. The device as defined in claim 6, wherein said housing comprises a height overall of less than about 1 cm.

17. A device for operating liquid in the vacuum or low-pressure environment and observing the operation, comprising:
- a housing having a plurality of spacers partitioning off an interior space of the housing into a vapor chamber and at least one buffer chamber formed outside said vapor chamber, each of said spacers located respectively above and below said vapor chamber having an inner aperture, said housing having two outer apertures formed on its top and bottom sides, a gas inlet corresponding to said vapor chamber, and a pumping port corresponding to said buffer chamber;
- a specimen holder having a target stage, said target stage having an opening, said housing having an insertion slot in communication with said vapor chamber, said specimen holder being inserted through said insertion slot into said vapor chamber to enable said inner apertures to be coaxial with said opening; and
- a liquid box placed on said target stage and containing a liquid specimen inside, said liquid box having two vapor apertures formed respectively on its top and bottom sides, said vapor apertures being coaxial with said inner and outer apertures.

18. The device as defined in claim 17, wherein each of said vapor apertures is taper-shaped whereby the thickness of each sidewall is smallest at the center of the sidewall surrounding said vapor aperture.

19. The device as defined in claim 17, wherein said housing comprises a thinner part at its one side; said inner and outer apertures are located on said thinner part.

20. The device as defined in claim 17, wherein said target stage comprises a retaining wall surrounding said liquid box.

21. The device as defined in claim 17, wherein said liquid box and said target stage are connected with each other by an adhesive.

* * * * *